(12) United States Patent
Kennedy et al.

(10) Patent No.: US 6,306,244 B1
(45) Date of Patent: Oct. 23, 2001

(54) APPARATUS FOR REDUCING POLYMER DEPOSITION ON SUBSTRATE SUPPORT

(75) Inventors: William S. Kennedy, Redwood Shores; Thomas E. Wicker, Vallejo; Robert A. Maraschin, Cupertino; Joel M. Cook, Pleasanton; Alan M. Schoepp, Felton, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/358,429

(22) Filed: Jul. 22, 1999

Related U.S. Application Data

(63) Continuation of application No. 08/722,373, filed on Sep. 30, 1996, now abandoned.

(51) Int. Cl.[7] .............................................. H01L 21/3065
(52) U.S. Cl. ................... 156/345; 118/723 R; 118/723 I; 118/728; 216/67; 438/729
(58) Field of Search ........................... 156/345; 438/729; 216/67; 118/723 R, 723 I, 728

(56) References Cited

U.S. PATENT DOCUMENTS

| | | | |
|---|---|---|---|
| 4,340,462 | 7/1982 | Koch | 204/298 |
| 4,579,618 | 4/1986 | Celestino et al. | 156/345 |
| 4,948,458 | 8/1990 | Ogle | 156/643 |
| 5,200,232 | 4/1993 | Tappan et al. | 427/569 |
| 5,262,029 | 11/1993 | Erskine et al. | 204/298.15 |
| 5,298,465 | 3/1994 | Levy | 437/225 |
| 5,326,725 | 7/1994 | Sherstinsky et al. | 437/225 |
| 5,498,313 | 3/1996 | Bailey et al. | 156/643.1 |
| 5,516,367 | 5/1996 | Lei et al. | 118/725 |
| 5,547,539 * | 8/1996 | Arasawa et al. | 156/345 |
| 5,556,476 | 9/1996 | Lei et al. | 118/728 |
| 5,571,366 | 11/1996 | Ishii et al. | 156/345 |
| 5,740,009 | 4/1998 | Pu et al. | 361/234 |

FOREIGN PATENT DOCUMENTS

| | | |
|---|---|---|
| 0 628 644 | 12/1994 | (EP) . |
| 0 668 607 | 8/1995 | (EP) . |

* cited by examiner

*Primary Examiner*—Thi Dang
(74) *Attorney, Agent, or Firm*—Burns, Doane, Swecker & Mathis, LLP

(57) ABSTRACT

In a plasma processing system for processing substrates such as semiconductor wafers, deposition of polymer in an area between a focus ring and an electrostatic chuck in a plasma processing chamber is achieved by providing a clearance gas in a gap between the chuck and the focus ring. A series of channels delivers the clearance gas to the annular gap between the outer surface of the substrate support and the inner surface of the focus ring surrounding the substrate support. The clearance gas supplied to the annular gap is preferably a gas such as helium which will not affect the wafer processing operation. In the case of plasma etching, the clearance gas is supplied at a flow rate which is sufficient to block the migration of process gas and volative byproducts thereof into the annular gap without adversely affecting edge etch performance.

29 Claims, 2 Drawing Sheets

US 6,306,244 B1

APPARATUS FOR REDUCING POLYMER DEPOSITION ON SUBSTRATE SUPPORT

This application is a continuation, of application Ser. No. 08/722,373 filed Sep. 30, 1996, now abandoned.

FIELD OF THE INVENTION

The invention relates to an apparatus and method for reducing polymer buildup in a plasma processing chamber, and more particularly, the invention relates to the introduction of clearance gas into a gap in a substrate holder to avoid polymer deposition on exposed surfaces of the substrate holder.

BACKGROUND OF THE INVENTION

Vacuum processing chambers are generally used for chemical vapor depositing (CVD) and etching of materials on substrates by supplying process gas to the vacuum chamber and application of an RF field to the gas. Examples of parallel plate, inductively coupled plasma (TCP™, also called ICP), and electron-cyclotron resonance (ECR) reactors are disclosed in commonly owned U.S. Pat. Nos. 4,340,462; 4,948,458; and 5,200,232. The substrates are held in place within the vacuum chamber during processing by substrate holders. Conventional substrate holders include mechanical clamps and electrostatic clamps (ESC). Examples of mechanical clamps and ESC substrate holders are provided in commonly owned U.S. Pat. No. 5,262,029 and commonly owned U.S. Pat. No. 5,671,116. Substrate holders in the form of an electrode can supply radiofrequency (RF) power into the chamber, as disclosed in U.S. Pat. No. 4,579,618.

Substrates which are etched in an oxide etching process generally include an underlayer, an oxide layer which is to be etched, and a photoresist layer formed on top of the oxide layer. The oxide layer may be one of $SiO_2$, BPSG, PSG, or other oxide material. The underlayer may be Si, TiN, silicide, or other underlying layer or substrate material. During processing of substrates, unwanted polymer deposition on the surfaces of the chamber can occur. For instance, when the chamber heats up to above 80° C. during oxide etching, a reaction can occur wherein $CF_3$ forms $CF_2$ and HF. The formation of $CF_2$ leads to an increase in polymer deposition on surfaces within the chamber. These deposits may be removed between successive processing of wafers to provide more consistent processing of the wafers.

During etching of a substrate such as a semiconductor wafer in a plasma reactor, the polymer can build up on the cooled, exposed surfaces of the chamber including exposed surfaces of a substrate support such as an electrostatic chuck and other surfaces such as a dielectric annular cap/focus ring surrounding the substrate support. This buildup may cause problems if it flakes off and is carried onto the top surface of the electrostatic chuck. These contaminants on the top surface of the chuck can prevent the chuck from operating properly to hold the wafer securely. In addition, the contaminants can allow helium which is supplied under the wafer as a cooling medium to leak from beneath the wafer and reduce the wafer cooling. The contaminants can also be deposited on and adversely affect the wafer itself. The buildup of polymer can be removed by a cleaning step performed between the processing of successive wafers. Generally, cleaning can be performed by injecting oxygen into the chamber, striking a plasma and reacting the oxygen with the deposited polymer to achieve an aggressive oxygen clean of the processing chamber.

One area in which deposits of polymer can occur in a processing chamber is a narrow gap between the electrostatic chuck on which the wafer is supported and a focus ring which surrounds the electrostatic chuck. This gap allows for differences in manufacturing tolerances and thermal expansion of the chuck and focus ring. However, process gas and volatile byproducts within the chamber may migrate into the gap and cause undesirable polymer deposits in this area which may flake off and cause contamination of the wafer and/or chamber.

The aggressive oxygen cleaning of the processing chamber is undesirable because it adds to the wafer cycle time, reducing through-put of the system. In addition, the aggressive oxygen clean will shorten the lives of members within the processing chamber including the electrostatic clamp and focus ring due to ion bombardment of these members. As such, it would be desirable if substrate processing could be carried out without a need for the aggressive oxygen cleaning step to thereby shorten cycle time and extend the life of chamber components.

SUMMARY OF THE INVENTION

The present invention addresses the problem of deposition of polymer in a plasma processing chamber by providing a clearance gas stream which reduces polymer build-up on the substrate support.

According to one aspect of the present invention, a plasma processing apparatus includes a processing chamber, a substrate support having an outer surface, a member such as a focus ring supported on and surrounding the outer surface, the member having an inner surface forming a narrow gap between the outer surface of the substrate support and the member, the gap being in fluid communication with an interior of the processing chamber, and a clearance gas supply in fluid communication with the gap supplying clearance gas to the gap to block the migration of process gas and volatile byproducts thereof into the gap.

According to a further aspect of the present invention, a method of controlling polymer deposition within a plasma processing chamber includes placing a substrate on a substrate holder within the processing chamber, and introducing a clearance gas into a gap between the substrate holder and a member surrounding the substrate holder at a flow rate sufficient to prevent process gas in the processing chamber from passing into the gap. In the case of etching the substrate, the clearance gas flow rate is maintained below a level which would adversely affect edge etch performance.

BRIEF DESCRIPTION OF THE DRAWINGS

The invention will be described in greater detail with reference to the accompanying drawings in which like elements bear like reference numerals, and wherein.

DETAILED DESCRIPTION OF THE PREFERRED EMBODIMENTS

Figure 1:
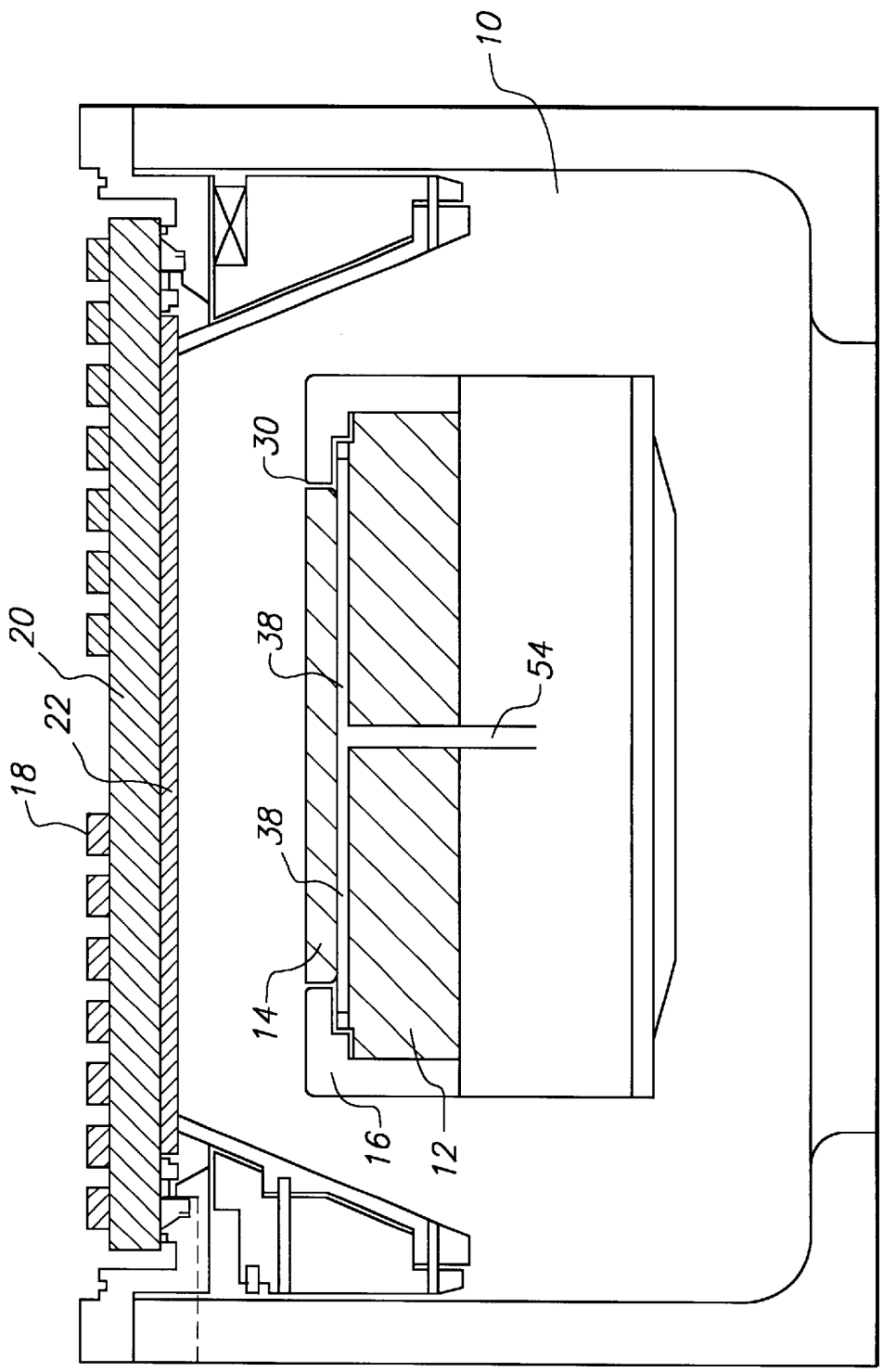
FIG. 1 is a cross sectional view of a vacuum processing chamber.

A vacuum processing chamber according to one embodiment of the present invention is illustrated in FIG. 1. The vacuum processing chamber 10 includes a substrate holder 12 including an electrode providing an RF bias to a substrate supported thereon. The substrate holder 12 includes an electrostatic clamp 14 for clamping the substrate. The substrate which is placed on the electrostatic clamp is preferably cooled by helium backcooling (not shown) provided between the substrate and the electrostatic clamp. A ceramic focus ring 16 surrounds the electrostatic clamp 14.

The vacuum processing chamber includes a source of energy for maintaining a high density (e.g. $10^{11}$–$10^{12}$ ions/cm$^3$) plasma in the chamber such as an antenna 18 (such as a planar spiral coil or other suitable design) which is positioned above the chamber and powered by a suitable RF source. A suitable RF impedance matching circuit inductively couples RF energy into the chamber 10 so as to provide a high density plasma. The chamber 10 also includes a suitable vacuum pumping apparatus for maintaining the interior of the chamber at a desired pressure (e.g. below 50 mTorr, typically 1–20 mTorr). A dielectric window 20 (such as a uniformly thick and planar sheet of quartz, alumina, silicon nitride, etc.) is provided between the antenna 18 and the interior of the processing chamber 10 and forms the vacuum chamber wall at the top of the processing chamber 10. A dielectric gas distribution plate, commonly called a showerhead 22, may be provided beneath the window 20 and includes a plurality of openings such as circular holes (not shown) for delivering process gas supplied by a gas supply to the processing chamber 10. However, the gas distribution plate 22 can be omitted and process gas can be supplied to the chamber by other arrangements such as gas rings, etc.

Figure 2:
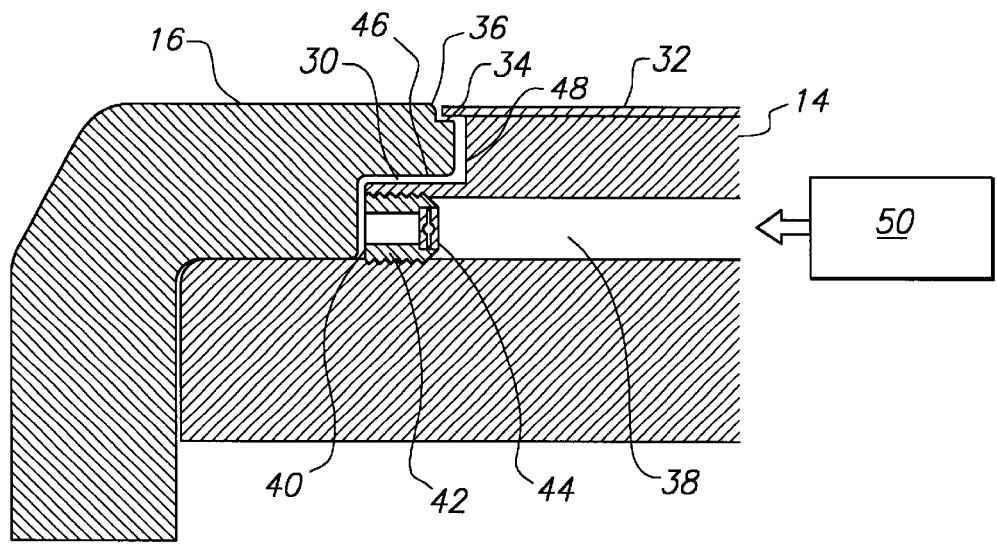
FIG. 2 is an enlarged cross sectional view of a portion of FIG. 1 showing the space between the electrostatic chuck and the focus ring.

FIG. 2 is an enlarged cross sectional view of an outer portion of the electrostatic chuck 14 and the focus ring 16 and illustrates a narrow space 30 (e.g., less than ¼ inch) which is provided between the two members. The annular space 30 provides clearance between an inner surface 46 of the focus ring and an outer surface 48 of the electrostatic chuck 14 to allow for manufacturing tolerances and the different thermal expansions of the elements. A substrate in the form of a semiconductor wafer 32 is positioned on the electrostatic chuck 14 and held in place by a suitable electrostatic clamping force. A small vertical clearance space 34 is provided between an overhanging edge of the wafer 32 and a groove 36 provided in the edge of the focus ring 16. This vertical clearance space 34 is designed to prevent the overhanging edge of the wafer 32 from being lifted and thereby avoid a reduction in clamping force applied by the electrostatic chuck.

According to the present invention, a flow of a clearance gas such as helium gas from a clearance gas supply 50 is provided to the annular space 30 to prevent entry of process gas and volatile byproducts thereof through the vertical clearance space 34 into the annular space 30. The flow of the clearance gas minimizes deposition of polymer within the annular space 30 which may flake off and be carried onto the top surface of the chuck or onto the substrate during processing. In this embodiment, the flow of the clearance gas is provided by a series of radially extending channels 38 in the electrostatic chuck 14. The channels 38 have orifices 40 spaced around the circumference of the electrostatic chuck 14 and provide clearance gas to the annular space 30. As shown in FIG. 1, the channels 38 may be connected to an axially extending central passage 54 through which the clearance gas is delivered. While a series of radially extending clearance gas supplying channels are shown in FIG. 1, it should be understood that any clearance gas delivery arrangement is within the scope of the invention.

As an example, clearance gas can be provided to the annular space 30 through eight radially extending channels 38. However, any number of channels or other arrangement of channels in the electrostatic chuck 14 may also be used to deliver the clearance gas to the annular space 30. Further, one or more clearance gas delivery channels may be formed in the focus ring for delivery of clearance gas to the annular space 30 or helium can be supplied to the space 30 through supply passages in the chuck 14 and ring 16.

According to the present invention, a clearance gas flow rate is used which is sufficiently high to block migration of process gas and volatile byproducts thereof into the annular space 30 from the processing chamber. However, in the case of plasma etching, it is preferred that the gas flow rate must not be so high as to adversely affect edge etch performance by the presence of a gas expansion plume at the edge of the substrate. An example of an appropriate helium gas flow rate during oxide etching is 40 to 120 standard cubic centimeters per minute (SCCM), preferably 60 to 100 SCCM, and more preferably around 75 to 85 SCCM, and will depend on the particular dimensions and application of a particular processing chamber. In one tested processing chamber configuration for oxide etching 200 cm wafers, 80 SCCM of helium gas was found to accomplish the required exclusion of process gas yet did not disturb the processing of the wafer.

According to the embodiment of the invention shown in FIG. 2, the flow of clearance gas is provided by a fixed pressure clearance gas supply 50. The gas flow rate can also be controlled by insertion of hollow screws 42 into the orifices 40. For instance, the hollow screws can be provided with a jewel orifice plate 44 which has an opening with a desired diameter to achieve the desired gas flow rate into the annular space. The diameter of the opening in the orifice plate which is selected to achieve the desired flow rate will depend on various process conditions such as the type of process being carried out (etching, deposition, photoresist stripping, etc.), the pressure of the clearance gas supply, the size of the annular space, and the number of channels 38, etc.

Figure 3:
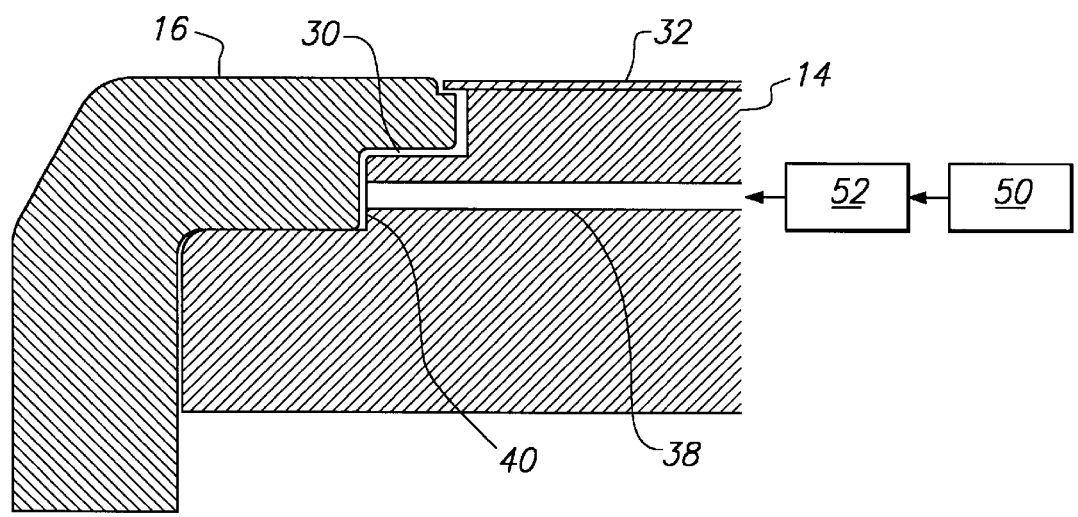
FIG. 3 is an enlarged cross sectional view of an alternative embodiment of the invention.

According to another embodiment of the invention, as shown in FIG. 3, a mass flow controller 52 is connected to the clearance gas supply 50 for varying the gas flow rate to the channels 38. In this embodiment, the hollow screws 42 with the jewel orifice plates 44 may be omitted because the flow rate is easily controlled either manually or automatically by the mass flow controller. In this embodiment, the orifices 40 have a constant diameter.

Although the invention has been described as employing helium gas for preventing process gas from entering the annular space 30, it should be understood that helium gas has been used by way of example only. Other gasses may also be used provided they will not affect the wafer processing operation which is being performed within the processing chamber.

While the invention has been described in detail with reference to a preferred embodiment thereof, it will be apparent to one skilled in the art that various changes can be made, and equivalents employed without departing from the spirit and scope of the invention.

What is claimed is:

1. A plasma processing apparatus and a substrate mounted therein comprising:
   a processing chamber;
   a power source which energizes process gas in an interior of the processing chamber into a plasma state for processing a substrate;
   a substrate support which supports a substrate within the interior of the processing chamber, the substrate support having an outer surface;

a substrate supported on the substrate support in overhanging relationship therewith;

a focus ring surrounding the substrate support, the focus ring having an inner surface forming a gap between the outer surface of the substrate support and the focus ring, the gap being in fluid communication with the interior of the processing chamber, the substrate extending over at least part of the focus ring such that the inner surface of the focus ring is located inwardly of an outer periphery of the substrate; and a clearance gas supply in fluid communication with the gap and which supplies clearance gas to the gap to block migration of process gas and volatile byproducts thereof into the gap during processing of the substrate, the clearance gas supply including a plurality of radially extending gas passages having outlets in the gap.

2. The plasma processing apparatus according to claim 1, wherein the power source comprises a coil which inductively couples the RF power through a dielectric window and forms a high density plasma in the processing chamber.

3. The plasma processing apparatus according to claim 1, wherein the clearance gas supply supplies helium to the gap.

4. The plasma processing apparatus according to claim 1, wherein the clearance gas supply supplies the clearance gas at a flow rate of 60 to 100 sccm.

5. The plasma processing apparatus according to claim 1, wherein the clearance gas supply includes eight radially extending gas passages having outlets in the gap.

6. The plasma processing apparatus according to claim 5, wherein the clearance gas passages are provided with flow restricting portions for controlling the flow rate of the clearance gas.

7. The plasma processing apparatus according to claim 5, wherein the clearance gas passages are provided in the substrate support.

8. The plasma processing apparatus according to claim 1, wherein the focus ring comprises a ceramic focus ring and the gap is less than ¼ inch between the inner and outer surfaces.

9. The plasma processing apparatus according to claim 1, wherein the substrate support comprises an electrostatic chuck.

10. The plasma processing apparatus according to claim 1, wherein the clearance gas supply includes an axially extending passage supplying the clearance gas to the radially extending gas passages.

11. The plasma processing apparatus according to claim 1, wherein the gap includes a first space between opposed vertically extending surfaces of the focus ring and the substrate support, a second space between opposed horizontally extending surfaces of the focus ring and the substrate support, and a third space between opposed vertically extending surfaces of the focus ring and the substrate support.

12. The plasma processing apparatus according to claim 1, further comprising a hollow screw in each of the outlets, the hollow screw including a jewel orifice plate having an opening therein sized to achieve a desired flow rate of the clearance gas into the gap.

13. A substrate support for a plasma processing apparatus having a processing chamber and a power source which energizes process gas in an interior of the processing chamber into a plasma state for processing a substrate, the substrate support comprising:

a substrate support surface which supports a substrate within the interior of the processing chamber, the substrate support having an outer surface;

a substrate supported on the substrate support surface in overhanging relationship therewith;

a focus ring supported on and surrounding the substrate support, the focus ring having an inner surface forming a gap between the outer surface of the substrate support and the focus ring, the gap being in fluid communication with the interior of the processing chamber when the substrate support is mounted in the processing chamber, the substrate extending over at least part of the focus ring such that the inner surface of the focus ring is located inwardly of an outer periphery of the substrate; and a clearance gas supply in fluid communication with the gap and adapted to supply clearance gas to the gap at a flow rate which is sufficient to block migration of process gas and volatile byproducts thereof into the gap during processing of a substrate supported on the substrate support surface, the clearance gas supply including a plurality of radially extending gas passages having outlets in the gap.

14. The substrate support according to claim 13, wherein the substrate support comprises an electrostatic chuck and the focus ring comprises a ceramic focus ring.

15. The substrate support according to claim 13, wherein the clearance gas supply includes eight radically extending gas passages having outlets in the gap.

16. The substrate support according to claim 15, wherein the clearance gas passages are provided with flow restricting portions for controlling the flow rate of the clearance gas.

17. The substrate support according to claim 15, wherein the clearance gas passages are provided in the substrate support.

18. The substrate support according to claim 13, wherein the clearance gas supply includes an axially extending passage supplying the clearance gas to the radially extending gas passages.

19. The substrate support according to claim 13, wherein the gap includes a first space between opposed vertically extending surfaces of the focus ring and the substrate support, a second space between opposed horizontally extending surfaces of the focus ring and the substrate support, and a third space between opposed vertically extending surfaces of the focus ring and the substrate support.

20. The substrate support according to claim 13, further comprising a hollow screw in each of the outlets, the hollow screw including a jewel orifice plate having an opening therein sized to achieve a desired flow rate of the clearance gas into the gap.

21. A method of controlling polymer deposition within a plasma processing chamber comprising:

placing a substrate on a substrate holder within the processing chamber;

energizing process gas in an interior of the processing chamber into a plasma state for processing the substrate; and introducing a clearance gas supplied by a clearance gas supply into a gap between the substrate holder and a focus ring supported by and surrounding the substrate holder, the substrate extending over at least part of the focus ring such that an inner surface of the focus ring is located inwardly of an outer periphery of the substrate, the clearance gas being supplied at a flow rate sufficient to minimize migration of process gas and volatile byproducts thereof into the gap, the clearance gas supply including a plurality of radially extending gas passages having outlets in the gap.

22. The method according to claim 21, wherein the substrate is held in place within the processing chamber by an electrostatic chuck, and the process gas is energized into the plasma state by a power source which supplies RF power to a coil which inductively couples the RF power through a dielectric window and forms a high density plasma in the processing chamber.

23. The method according to claim 21, wherein the clearance gas introduced into the gap comprises helium.

24. The method according to claim 21, wherein the clearance gas is introduced at a flow rate of 60 to 100 sccm.

25. The method according to claim 21, wherein the clearance gas flows into the gap through eight radially extending passages having outlets in the gap.

26. The method according to claim 21, wherein the substrate is etched by the process gas and the clearance gas is supplied at a flow rate which does not adversely affect etch edge performance.

27. The method according to claim 21, wherein the clearance gas supply includes an axially extending passage supplying the clearance gas to the radially extending gas passages.

28. The method according to claim 21, wherein the gap includes a first space between opposed vertically extending surfaces of the focus ring and the substrate support, a second space between opposed horizontally extending surfaces of the focus ring and the substrate support, and a third space between opposed vertically extending surfaces of the focus ring and the substrate support, the clearance gas flowing sequentially through the first, second and third spaces followed by passing through a fourth space between the substrate and the focus ring.

29. The method according to claim 21, wherein a hollow screw is located in each of the outlets, the hollow screw including a jewel orifice plate having an opening therein, the method further comprising use of a jewel orifice plate having the opening therein sized to achieve a desired flow rate of the clearance gas into the gap.

* * * * *